(12) United States Patent
Al-Ghamdi et al.

(10) Patent No.: US 10,490,314 B2
(45) Date of Patent: Nov. 26, 2019

(54) GRAPHENE OXIDE FREE-STANDING FILM AND METHODS FOR SHIELDING ELECTROMAGNETIC RADIATION AT MICROWAVE FREQUENCIES

(71) Applicant: King Abdulaziz University, Jeddah (SA)

(72) Inventors: Ahmed A. Al-Ghamdi, Jeddah (SA); Yusuf Al-Turki, Jeddah (SA); Fahrettin Yakuphanoglu, Elazig (TR); Farid El-Tantawy, Ismailia (EG)

(73) Assignee: King Abdulaziz University, Jeddah (SA)

( * ) Notice: Subject to any disclaimer, the term of this patent is extended or adjusted under 35 U.S.C. 154(b) by 712 days.

(21) Appl. No.: 15/040,429

(22) Filed: Feb. 10, 2016

(65) Prior Publication Data

US 2017/0047139 A1 Feb. 16, 2017

Related U.S. Application Data

(60) Provisional application No. 62/204,273, filed on Aug. 12, 2015.

(51) Int. Cl.
  *B32B 9/00* (2006.01)
  *H01B 1/04* (2006.01)
  (Continued)

(52) U.S. Cl.
  CPC ............... *H01B 1/04* (2013.01); *C01B 32/23* (2017.08); *C23C 14/0021* (2013.01);
  (Continued)

(58) Field of Classification Search
  CPC ........ C01B 31/04; B82Y 30/00; Y10T 428/30
  (Continued)

(56) References Cited

U.S. PATENT DOCUMENTS

| 5,597,979 A | 1/1997 | Courtney et al. |
| 8,633,402 B2 | 1/2014 | Bunyan et al. |
| (Continued) | | |

FOREIGN PATENT DOCUMENTS

| JP | 2012-250872 A | 12/2012 |
| WO | WO 2014/124308 A2 | 8/2014 |

OTHER PUBLICATIONS

Nan Li, Synthesis of graphenes with arc discharge methods, Physics and applications of Graphene—Experiments Apr. 19, 2011.*

(Continued)

*Primary Examiner* — Daniel H Miller
(74) *Attorney, Agent, or Firm* — Oblon, McClelland, Maier & Neustadt, L.L.P.

(57) ABSTRACT

A composition of graphene oxide free-standing film, a method of making the film, and a method of using the film to shield electromagnetic radiation particularly at microwave frequencies from 1 GHz to 12 GHz. The composition comprises stacked layers of graphene oxide nanosheets oriented parallel to the film surface and stacked layers of graphene oxide nanosheets oriented perpendicular to the film surface. The method of making the composition includes forming graphene oxide by arc-discharge between graphite electrodes in the presence of oxygen gas to form a graphene oxide soot, suspending the graphene oxide soot in water to form a colloid, depositing the colloid onto a substrate to form a wet paper, and drying the wet paper to form the film. The method of using the composition to shield electromagnetic radiation includes enclosing and/or encapsulating an electromagnetic radiation generating source with the free-standing film to shield electromagnetic radiation.

15 Claims, 7 Drawing Sheets

(51) Int. Cl.
- *C23C 14/22* (2006.01)
- *H05K 9/00* (2006.01)
- *C23C 14/00* (2006.01)
- *C23C 14/08* (2006.01)
- *C23C 14/32* (2006.01)
- *C01B 32/23* (2017.01)
- *B82Y 30/00* (2011.01)
- *B82Y 40/00* (2011.01)

(52) U.S. Cl.
CPC .............. *C23C 14/08* (2013.01); *C23C 14/22* (2013.01); *C23C 14/325* (2013.01); *H05K 9/009* (2013.01); *B82Y 30/00* (2013.01); *B82Y 40/00* (2013.01)

(58) Field of Classification Search
USPC .......................................... 428/408; 423/448
See application file for complete search history.

(56) References Cited

U.S. PATENT DOCUMENTS

2006/0112857 A1* 6/2006 Hougham .............. B82Y 30/00
106/472ke
2007/0092432 A1* 4/2007 Prud'Homme ........ B82Y 30/00
423/448
2010/0301279 A1 12/2010 Nesper et al.
2013/0068521 A1 3/2013 Hong et al.
2013/0333937 A1 12/2013 Avouris et al.
2014/0147473 A1 5/2014 Yao et al.
2014/0205841 A1 7/2014 Qiu et al.

OTHER PUBLICATIONS

Tatsuya Sugimoto, et al., "Stability of Graphene Oxide Film to Electron Beam Irradiation and Possible Thickness Dependence of Electron Attenuation", Bulletin of the Chemical Society of Japan, BCSJ Award Article, Feb. 20, 2013. pp. 1-6.

Suenne Kim, et al., "Room Temperature Metastability of Multilayer Graphene Oxide Films", Nature Materials, Nature Publishing Group, vol. 11, 2011, pp. 544-549.

E. Badiei, et al., "Graphene Oxide Antibacterial Sheets: Synthesis and Characterization", International Journal of Engineering, IJE Transactions C: Aspects, vol. 27, No. 12, Dec. 2014, pp. 1803-1808.

* cited by examiner

GRAPHENE OXIDE FREE-STANDING FILM AND METHODS FOR SHIELDING ELECTROMAGNETIC RADIATION AT MICROWAVE FREQUENCIES

This application claims the benefit of U.S. Provisional Application No. 62/204,273, filed Aug. 12, 2015. The provisional application identified above is incorporated here by reference in its entirety to provide continuity of disclosure.

BACKGROUND OF THE INVENTION

Technical Field

The present disclosure relates to a graphene oxide free-standing film, a method of making the film, and a method of using the film to shield electromagnetic radiation, especially at microwave frequencies from 1 GHz to 12 GHz.

Description of the Related Art

The "background" description provided herein is for the purpose of generally presenting the context of the disclosure. Work of the presently named inventors, to the extent it is described in this background section, as well as aspects of the description which may not otherwise qualify as prior art at the time of filing, is neither expressly or impliedly admitted as prior art against the present invention.

Electromagnetic radiation emitted by electrical and electronic devices not only reveals sensitive information about the devices, but also interferes with their operation and inflicts various health hazards on exposed individuals, particularly when the electromagnetic radiation is at microwave frequencies from 300 MHz to 300 GHz. In fact, the World Health Organization has confirmed that exposure to microwave radiation could increase the risk of brain cancer. As a result, various shielding materials have been developed, including metals, conductive ceramic sheetings, and graphene or carbon nanotubes, however, they are heavy, expensive, and/or prone to corrosion and leakage of radiation. Further, as microwave radiation becomes more energetic at higher frequencies, e.g. above 8 GHz, and thus more harmful to exposed individuals, the radiation leakage exhibited by those shielding materials becomes more severe.

It therefore would be useful to provide compositions and methods for effectively shielding electromagnetic radiation, particularly at microwave frequencies, wherein the compositions are relatively light, corrosion resistant and flexible, and can be provided and incorporated into devices and/or existing shielding materials at relatively low cost. Graphene oxide is a compound of carbon oxygen, and hydrogen in variable ratios, obtained by treating graphite with strong oxidizers. The oxidized bulk product is a yellow solid with C/O ratio between 2.1 and 2.9, that retains the layer structure of graphite but with a much larger and irregular spacing.

Graphene oxide is hydrophilic and can be dispersed in water. When sifted out of the dispersion (as in paper manufacture) and dried, solid graphene oxide forms an exceedingly strong free-standing graphene oxide film comprising stacked layers of graphene oxide nanosheets.

The structure and properties of graphene oxide depend on the particular synthesis method and degree of oxidation, however, the graphene oxide structure typically preserves the layer structure of the parent graphite.

BRIEF SUMMARY OF THE INVENTION

According to a first aspect, the present disclosure relates to a free-standing film that absorbs and/or reflects electromagnetic radiation having a frequency from 1 GHz to 12 GHz. The free-standing film comprises stacked layers of graphene oxide nanosheets oriented parallel to the film surface and stacked layers of graphene oxide nanosheets oriented perpendicular to the film surface.

In one or more embodiments, the graphene oxide nanosheets in the free-standing film have an average thickness of from 4 to 8 nm.

In one or more embodiments, at least one of the stacked layers of graphene oxide nanosheets in the free-standing film is doped with an effective amount of a dopant to absorb and/or reflect electromagnetic radiation at frequencies ranging from 1 GHz to 12 GHz.

In one or more embodiments, the dopant comprises at least one acid selected from the group consisting of hydrobromic acid, hydroiodic acid, nitric acid, sulfuric acid, oleum, hydrochloric acid citric acid, and oxalic acid, and/or at least one metal salt selected from the group consisting of gold chloride and silver nitrate.

In one or more embodiments, the free-standing film further comprises a flexible substrate comprising an electrically insulating material, and at least one stacked layer of graphene oxide nanosheets is disposed on the flexible substrate.

In one or more embodiments, the free-standing film further comprises at least one metal or alloy substrate, with the free-standing film disposed on the at least one metal or alloy substrate.

In one or more embodiments, the free-standing film further comprises at least one conductive ceramic substrate, with the free-standing turn disposed on the at least one conductive ceramic substrate.

According to a second aspect, the present disclosure relates to an electrical or electronic device covered with the free-standing film of the first aspect of the disclosure.

According to a third aspect, the present disclosure relates to an electromagnetic interference (EMI) shielding gasket comprising the free-standing film of the first aspect of the disclosure.

According to a fourth aspect, the present disclosure relates to a method for making the free-standing film of the first aspect of the disclosure. The method comprises (a) forming graphene oxide by arc-discharge between graphite electrodes in the presence of oxygen gas to form a graphene oxide soot, (b) suspending the graphene oxide soot in water to form a colloid, (c) depositing the colloid onto a substrate to form a wet paper, and (d) drying the wet paper to form the film.

In one or more embodiments, each of the graphite electrodes has a diameter ranging from 1 mm to 10 mm and a length ranging from 100 mm to 400 mm.

In one or more embodiments, the arc-discharge is carried out with the arc gap between the graphite electrodes ranging from 0.5 mm to 2 mm, the voltage ranging from 25 KV to 100 KV, and the DC current ranging from 10 A to 50 A.

According to a fifth aspect, the present disclosure relates to a method of shielding electromagnetic radiation by using the free-standing film of the first aspect of the disclosure. The method comprises enclosing and/or encapsulating an electromagnetic radiation generating source with the free-standing film to shield electromagnetic radiation.

In one or more embodiments, the thickness of the free-standing film used to shield electromagnetic radiation ranges from about 1 mm to about 5 mm.

In one or more embodiments, the frequencies of the electromagnetic radiation shielded by the free-standing film range from 1 GHz to 12 GHz.

In one or more embodiments, the free-standing film provides a shielding effectiveness of at least about 60 dB for the electromagnetic radiation at frequencies ranging from 1 GHz to 12 GHz.

In one or more embodiments, the free-standing film provides a shielding effectiveness of at least about 70 dB for the electromagnetic radiation at 1 GHz frequency.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
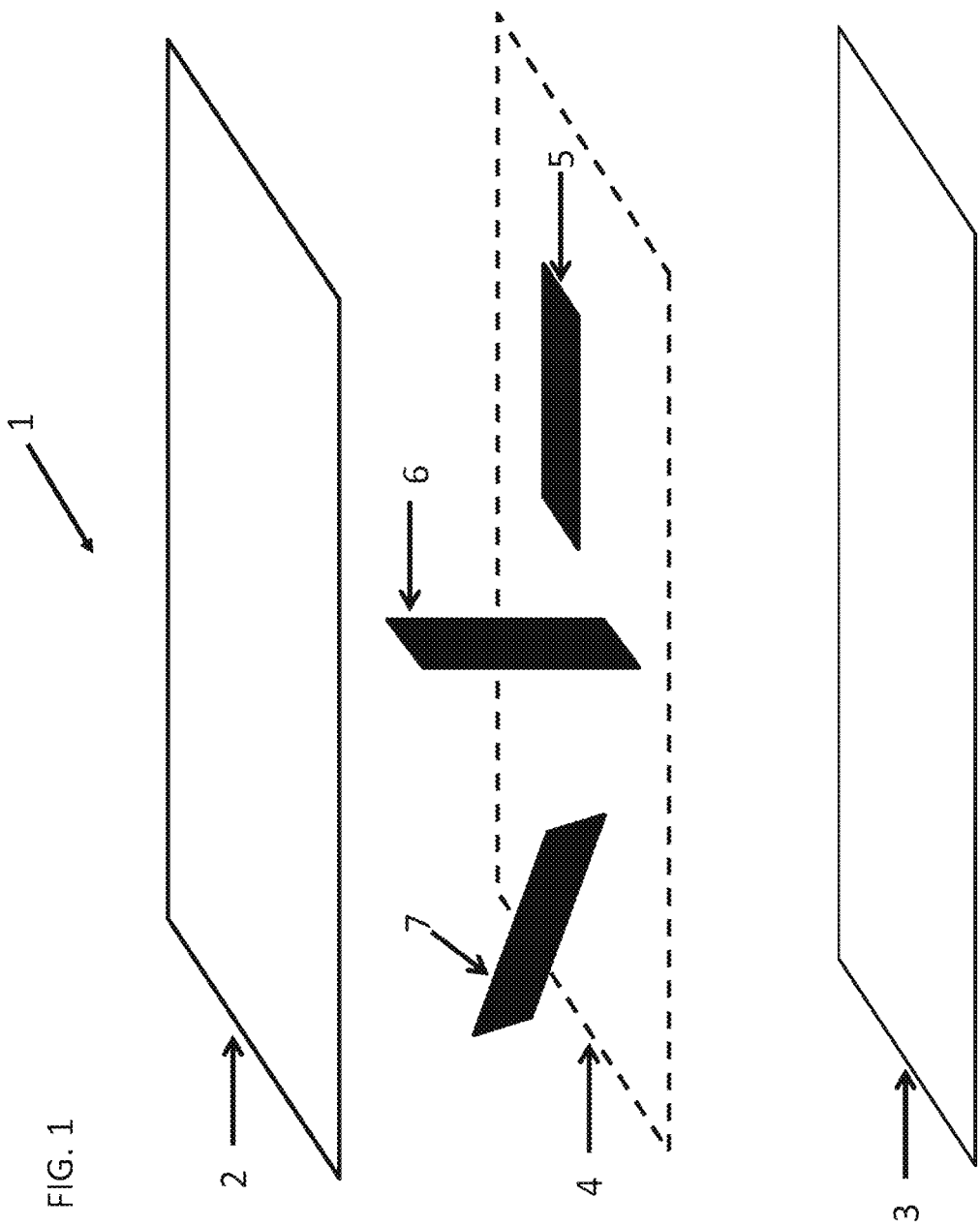
FIG. 1 is a diagram illustrating graphene oxide nanosheets oriented parallel to and perpendicular to the surface of a graphene oxide free-standing film comprising the nanosheets.

Disclosed herein are a composition and methods for making and using the composition to shield electromagnetic radiation, particularly at microwave frequencies from 1 GHz to 12 GHz, emitted from an electromagnetic radiation source. The electromagnetic shielding composition comprises a free-standing film comprising stacked layers of graphene oxide nanosheets oriented parallel to the film surface and/or stacked layers of graphene oxide nanosheets oriented perpendicular to the film surface. FIG. 1 is an illustration of a graphene oxide free-standing film 1 with a top surface 2 and a bottom surface 3. The vertical distance between the top surface 2 and the bottom surface 3 defines the thickness of the film 1. A graphene oxide nanosheet 5 is parallel to the surface of the film 1, since the basal plane of the graphene oxide nanosheet 5 completely lies within and parallel to a horizontal cross-section 4 of the film 1. A graphene oxide nanosheet 6, by contrast, is perpendicular to the surface of the film 1, since the basal plane of the graphene oxide nanosheet 6 stands perpendicular to the horizontal cross-section 4 of the film 1. Wrinkled, rippled, or corrugated portions of graphene oxide nanosheets not contained in the basal plane of the graphene oxide nanosheets (and described below) are not shown for simplicity in FIG. 1. In other embodiments, graphene oxide nanosheets are in orientations that are not exactly parallel or perpendicular to the surfaces of the film, as illustrated by a graphene oxide nanosheet 7 in FIG. 1.

In one embodiment, the graphene oxide has the chemical formula $C_8O_4H_{1.7}$ (based on the elemental analysis). After subtraction of hydrogen as water, $C_8O_{3.2}$ is obtained with a C/O ratio of 2.5. Using X-ray diffraction analysis, it can be shown that dry graphene oxide has the inter-planar distance of 6.1 Å, nearly double the inter-planar distance of 3.35 Å in graphite. In the present disclosure, graphene oxide preferably has a C/O ratio of at least 0.5, more preferably at least 1.0, more preferably at least 1.2; but less than 4, preferably less than 3.5, more preferably less than 3, more preferably less than 2.5, and most preferably less than 2.1. By contrast, graphene and graphite are carbonaceous materials with a C/O ratio of 4 or higher, such as about 7, at least 13.5, at least 20, and at least 25.

In one embodiment, the graphene oxide nanosheets in the free-standing graphene oxide film have an average thickness of from 4 to 10 nm, preferably from 6 to 8 nm or about 6 nm. Depending on the methods of synthesizing the graphene oxide, which include, but are not limited to, arc-discharge (described below), the Hummers Method, and the Brodie Method, a graphene oxide free-standing film comprising graphene oxide nanosheets of varying thickness may be obtained, and may also be effective in absorbing and/or reflecting electromagnetic radiation, including that at microwave frequencies from 1 GHz to 12 GHz. The width of the nanosheets can be several micrometers. In one embodiment, the graphene oxide nanosheets have a width of about 7 μm. In some embodiments, the width of graphene oxide nanosheets may range from about 1 μm to about 20 μm. In other embodiments the width may range from about 3 μm to about 18 μm. In other embodiments, the width may range from about 5 μm to about 15 μm. In other embodiments, the width may range from about 7 μm to about 12 μm. In still other embodiments, the width may range from about 8 μm to about 10 μm.

Figure 2:
FIG. 2 is a field emission scanning electron microscope (FESEM) image of graphene oxide nanosheets in a graphene oxide free-standing film.
Figure 3:
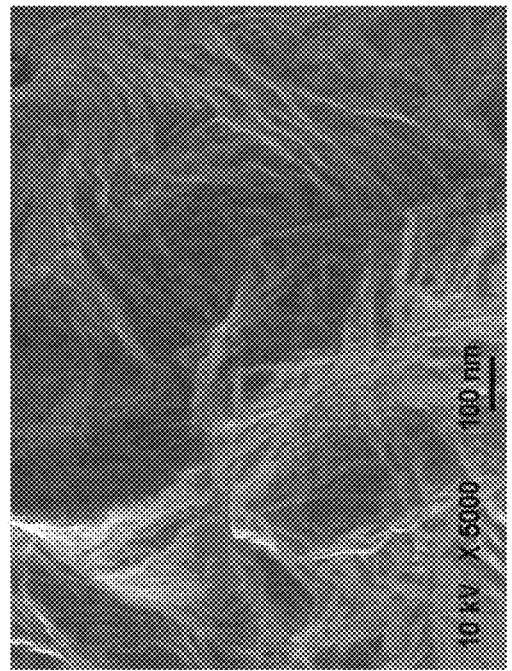
FIG. 3 is a transmission electron microscope (TEM) image of a graphene oxide free-standing film.

In one embodiment, the graphene oxide nanosheets in a free-standing film may have wrinkled and/or rippled morphologies (FIGS. 2 and 3), representing a number of stacked layers of graphene oxide nanosheets oriented parallel and perpendicular to the film surface. The height of the wrinkles or ripples from the basal plane of the graphene oxide nanosheets may range from less than 0.2 nm to about 3 nm, preferably from about 0.5 nm to about 2.5 more preferably from about 1 nm to about 2 nm, and more preferably from about 0.5 nm to about 1.5 nm. The number of wrinkles or ripples of a graphene oxide nanosheet can vary, for example, from 1 to about 10, depending on the chemical structure, the size of the nanosheet, and other factors.

In another embodiment, the stacked layers of graphene oxide nanosheets may be scrolled, i.e. forming a multilayer micron-sized cylindrical structure with two open ends and a hollow center. In some embodiments, the scroll has a diameter of about 0.5 to 5 microns and a length of about 3 to 40 microns, more preferably a diameter of about 1 to 4 microns and a length of about 5 to 30 microns, more preferably a diameter of about 2 to 3 microns and a length of about 10 to 20 microns. In still another embodiment, the stacked layers of graphene oxide nanosheets may be corrugated, with substantially greater surface area than non-corrugated nanosheets of comparable size, contributing to greater electrical conductivity and electromagnetic radiation shielding effectiveness.

In one embodiment, the graphene oxide nanosheets in the free-standing film may be transparent and exhibit a very stable nature under an electron beam. By contrast, a graphene oxide film obtained by an ordinary filtration method and/or thick enough to effectively shield electromagnetic radiation as described in the present disclosure is not transparent.

Multilayer graphene oxide is a metastable material whose structure and chemistry evolve at room temperature with a characteristic relaxation time of about one month. At the quasi-equilibrium, graphene oxide reaches a nearly stable reduced O/C ratio, and exhibits a structure deprived of epoxide groups and enriched in hydroxyl groups. The structural and chemical changes of a graphene oxide film are driven by the availability of hydrogen in the oxidized graphitic sheets, which favors the reduction of epoxide groups and the formation of water molecules.

The size of the graphene oxide nanosheets within a free-standing film and between different film preparations can vary. In some embodiments, the graphene oxide nanosheets in a free-standing film can have an area ranging from about 10 $nm^2$ to about 1000 $nm^2$, preferably 20-900 $nm^2$, more preferably 40-800 $nm^2$, more preferably 60-700 $nm^2$, more preferably 80-600 $nm^2$, more preferably 100-500 ore preferably 150-400 $nm^2$, or more preferably 200-300 $nm^2$. Graphene oxide nanosheets of other sizes may be obtained, for example, by using different graphene oxide synthesis methods and/or changing the conditions of preparing a graphene oxide free-standing film, e.g. by optionally using ultrasonic treatment to accelerate graphene oxide dispersion in water to form a colloid. Graphene oxide nanosheets less than 10 $nm^2$ or more than 1000 $nm^2$ may also be effective in absorbing and/or reflecting electromagnetic radiation.

In one embodiment, the electromagnetic radiation shielding effectiveness of the graphene oxide free-standing film may be increased by doping at least one of the stacked layers of graphene oxide nanosheets with an effective amount of a dopant to absorb and/or reflect electromagnetic radiation at frequencies ranging from 1 GHz to 12 GHz. The dopants may be applied as a solution and/or as a vapor, to a graphene oxide/water colloid, or to one side or both sides of a single graphene oxide free-standing film or a stack thereof. By way of example a dopant solution may be sprayed onto the surface(s) of a graphene oxide free-standing film. Alternatively, a dopant solution may be added to a graphene oxide/water colloid, followed by recovering the doped graphene oxide solid, for example, by filtration described below) and drying the doped graphene oxide solid to form a film. In case of using a dopant vapor, the dopant vapor may be formed by a heating apparatus for vaporizing the dopant solution in a vessel containing the dopant solution.

The dopant may include, but not be limited to, at least one selected from the group consisting of ionic liquid, ionic gas, an acidic compound, and an organic molecular system compound. Examples of suitable dopants for increasing shielding effectiveness include oxidizing dopants, such as, without limitation, hydrobromic acid, hydroiodic acid, nitric acid, sulfuric acid, oleum, hydrochloric acid, citric acid, oxalic acid, or metal salts, examples of which include, but are not limited to, gold chloride, silver nitrate, and the like.

In one embodiment, exposing the graphene oxide film to an effective amount of a dopant solution and/or vapor leads to an increase in the conductivity and a reduction of the graphene oxide free-standing film resistance.

In another embodiment, the graphene oxide free-standing film is doped to effect increased reflection of electromagnetic radiation. In that case, the dopant concentration (n) may be greater than 1 $e10^{13}$ $cm^{-2}$. In another embodiment, the graphene oxide film is doped to effect increased absorption of electromagnetic radiation, with the dopant concentration (n) at 1 $e10^{13}$ $cm^{-2}$>n>1 $e10^{12}$ $cm^{-2}$. In other embodiment, the dopant concentration (n) is at 1 $e10^{12}$ $cm^{-2}$>n>0 $cm^{-2}$.

In one embodiment, the graphene oxide free-standing film, or at least one stacked layer of graphene oxide nanosheets thereof, may be disposed on a flexible substrate comprising an electrically insulating material. The resulting graphene oxide film/flexible substrate composite may then be applied to an object to be shielded. In another embodiment, the graphene oxide free-standing film in the composite is a doped graphene oxide free-standing film.

Non-limiting examples of suitable flexible substrate materials include polyurethanes, silicones, fluorosilicones, polycarbonates, ethylene vinyl acetates, acrylonitrile-butadiene-styrenes, polysulfones, acrylics, polyvinyl chlorides, polyphenylene ethers, polystyrenes, polyamides, nylons, polyolefins, poly(ether ether ketones), polyimides, polyetherimides, polybutylene terephthalates, polyethylene terephthalates, fluoropolymers, polyesters, acetals, liquid crystal polymers, polymethylacrylates, polyphenylene oxides, polystyrenes, epoxies, phenolics, chlorosulfonates, polybutadienes, buna-N, butyls, neoprenes, nitriles, polyisoprenes, natural rubbers, and copolymer rubbers such as styrene-isoprene-styrenes, styrene-butadiene-styrenes, ethylene-propylenes, ethylene-propylene-diene monomers (EPDM), nitrile-butadienes, and styrene-butadienes (SBR), and copolymers and blends thereof. The step of combining the graphene oxide film with one or more of the flexible substrate materials to form a composite material can be done by using a variety of techniques known in the art that suitably preserve the integrity of the graphene oxide film, for example and without limitation, by sewing, taping, adhering via an adhesive, or by a mechanical fastening such as a slot and bead (Zip-lock) means.

Metals and metal alloys are frequently used as electromagnetic radiation shielding materials. Advantageously, the graphene oxide free-standing film may be disposed on one or more metal or alloy substrates to form a composite with increased shielding effectiveness. The one or more metal or alloy substrates may be selected from the group consisting of silicone, Ni, Co, Fe, Pt, Au, Al, Cr, Cu, Mg, Mn, Mo, Rh, Si, Ta, Ti, W, Ti, V, Zr, brass, bronze, white brass, stainless steel, and Ge. In another embodiment, the graphene oxide free-standing film in the composite is a doped graphene oxide free-standing film.

Conductive ceramics are also frequently used as electromagnetic radiation shielding materials. Likewise, the graphene oxide free-standing film can be advantageously disposed on one or more conductive ceramic substrates to form a composite with enhanced radiation shielding effectiveness. The one or more conductive ceramic substrates may be selected from the group consisting of lead oxide (PbO), ruthenium dioxide ($RuO_2$), bismuth ruthenate ($Bi_2Ru_2O_7$), bismuth iridate ($Bi_2Ir_2O_7$), indium oxide ($In_2O_3$), tin oxide ($SnO_2$), SiC, molybdenum disilicide ($MoSi_2$), lanthanum chromite ($LaCr_2O_4$), and zirconia ($ZrO_2$).

A second aspect of the disclosure relates to an electrical or electronic device covered with the graphene oxide free-standing film of the first aspect of the disclosure. In one embodiment, the electrical or electronic device is covered by the graphene oxide free-standing film by attaching the film to the device. In another embodiment, the electrical or electronic device is covered by the graphene oxide free-standing film by first applying the graphene oxide/water colloid to the device and then forming the graphene oxide film on the device by drying the colloid. In another embodiment, the electrical or electronic device is covered by a doped graphene oxide free-standing film. In another embodiment, the electrical or electronic device is covered by a (doped or not) graphene oxide free-standing film/flexible substrate composite. In still another embodiment, the electrical or electronic device is attached to, or wrapped or enclosed by a metal or alloy substrate on which is disposed a graphene oxide free-standing film, or a doped graphene oxide free-standing film. In still another embodiment, the electrical or electronic device can be enclosed by or covered with a composite comprising a (doped or not) graphene oxide free-standing film disposed on one or more conductive ceramic substrates.

A third aspect of the disclosure relates to an electromagnetic interference (EMI) shielding gasket comprising the graphene oxide free-standing film of the first aspect of the disclosure. Increasingly, electronic devices are using electronic enclosures, such as doors, access panels, and housings for shielding computer cabinets and drives, resulting in an elevated level of high frequency electromagnetic interference (EMI). Any gap between the metal surfaces confronting or mating with the doors and access panels affords an opportunity for the passage of electromagnetic radiation and the creation of electromagnetic interference. If not properly shielded, EMI radiation can cause considerable interference with unrelated electronic equipment. Accordingly, it is necessary to effectively shield all sources of electromagnetic radiation within an electronic system. Therefore, it is advisable to use a conducting shield or gasket between such surfaces to block the electromagnetic interference.

The graphene oxide free-standing film in the present disclosure has high electrical conductivity, because the layers of graphene oxide nanosheets are somewhat connected perpendicular to the free-standing film, i.e. the honeycomb microstructure of graphene oxide resembles an accordion, making the flexible graphene oxide free-standing film also electrically conductive in the direction perpendicular to the film, although not as conductive as in the direction parallel to the plane of the film. Secondly, the in-plane and out-of-plane microstructures make the graphene oxide free-standing film very resilient. Thirdly, the graphene oxide nanosheets provide the graphene oxide free-standing film with a large surface area. Lastly, the graphene oxide free-standing film is resistant to corrosion. All of the aforementioned properties make the graphene oxide free-standing film an advantageous material for EMI shielding gaskets.

In one embodiment, the gasket further comprises metal wire meshes or screens on which the graphene oxide film is disposed. In another embodiment, the gasket further comprises one or more elastomeric polymeric materials, wherein the one or more polymeric materials are filled with the graphene oxide free-standing film or fragments thereof. Non-limiting examples of suitable elastomeric polymers include polyethylene, polypropylene, polypropylene-EPDM blends, butadiene, styrene-butadiene, nitrile rubber, chlorosulfonate, neoprene, urethane, silicone, fluorosilicone, or a copolymer, blend or combination thereof.

The graphene oxide free-standing film filler can be present in amounts of from about 20% to about 80% by total weight of the filled polymer, preferably from about 30% to about 70%, more preferably from about 40% to about 60%, and most preferably about 50%. The graphene oxide free-standing film filler can have any shape and is preferably sized in the micron or sub-micron range. Suitable shapes include micron sized spheres, flakes and fibers. The gasket can be prepared by molding the filled elastomer into a convenient shape suitable for a particular application using conventional molding processes, such as injection molding or compression molding. Typical shapes include, by way of example, sheets, tapes, tubes, rods, etc. Alternatively, the filled elastomer can be formed into a larger sheet, for instance, and customized for a particular application by cutting the gasket to the desired size and shape.

A fourth aspect of the disclosure relates to a method of making the graphene oxide free-standing film of the first aspect of the disclosure. In one embodiment, each of the graphite electrodes used for arc-discharge is in a rod shape with a diameter ranging from 1 mm to 10 mm, preferably about 5 mm, and with a length ranging from 100 mm to 400 mm, preferably about 200 mm. In another embodiment, the arc-discharge is carried out with the arc gap between the graphite electrodes ranging from 0.5 mm to 2 mm, preferably about 1 mm, with the voltage ranging from 25 KV to 100 KV, preferably about 50 KV, and with the DC current ranging from 10 A to 50 A, preferably about 25 A. In another embodiment, the oxygen gas is supplied at a pressure between 100 Torr and 600 Torr, preferably about 260 Torr, and at a flow rate between 1 and 20 L/min, preferably between 5 and 10 L/min. In another embodiment, the duration of the arc-discharge process is between 1 second and 10 seconds, preferably about 2 seconds. In another embodiment, the graphene oxide/water colloid is prepared by stirring until the colloid appears clear to the eye. If no clear dispersion is obtained after 1 to 5 hours of stirring, the colloid may be centrifuged to remove undissolved impurities. Optionally, a minimal amount of ammonia may be added to the dispersion to shorten the time needed to disperse graphene oxide. Such an amount of ammonia is below a level that would alter the pH obtained in the absence of ammonia. It is also possible to accelerate graphene oxide dispersion in water by using ultrasonic treatment. However, such treatment reduces the size of the graphene oxide nanosheets, and may affect the shielding effectiveness (either positively or negatively) of the graphene oxide free-standing film comprising the treated nanosheets. In still another embodiment, the concentration of the graphene oxide/water colloid is between 0.5 mg/ml and 10 mg/ml, preferably about 5 mg/ml.

In one embodiment, the substrate that the graphene oxide colloid is deposited on is a filter paper. In another embodiment, the substrate may be an object to be shielded. In another embodiment, the substrate is an aforementioned flexible electrically insulating material. In another embodiment, the substrate is an aforementioned metal or alloy substrate. In still another embodiment, the substrate is an aforementioned conductive ceramic substrate.

By varying the volume of graphene oxide colloid applied on a substrate to be dried, a graphene oxide free-standing film of varying thickness, for example, between about 1 mm and about 5 mm thick, can be obtained. Additionally, the thickness of the graphene oxide free-standing film can be further increased by stacking and/binding multiple graphene oxide free-standing films.

A fifth aspect of the disclosure relates to a method of shielding electromagnetic radiation by using the graphene oxide free-standing film of the first aspect of the disclosure. An electromagnetic radiation source to be shielded may be virtually any object that includes an electronic circuit, non-limiting examples of which include computers, mobile and landline telephones, televisions, microwave ovens, radios, personal digital assistants, digital music players, medical instruments, automobiles, aircraft, and satellites.

In one embodiment, the graphene oxide free-standing film, doped or not, may be deposited on an electromagnetic radiation source. In another embodiment, the graphene oxide free-standing film, doped or not, may be first disposed on an aforementioned flexible substrate comprising an electrically insulating material, and the resulting graphene oxide film/flexible substrate composite may then be used to enclose and/or encapsulate an electromagnetic radiation source. In another embodiment, the graphene oxide free-standing film, doped or not, may be first disposed on an aforementioned metal or alloy substrate, and the resulting graphene oxide film/metal or alloy substrate composite may then be used to enclose, encapsulate, attach to, or wrap around an electromagnetic radiation source. In still another embodiment, the graphene oxide free-standing film, doped or not, may be first disposed on an aforementioned conductive ceramic substrate, and the resulting graphene oxide film/conductive ceramic substrate composite may then be used to enclose, encapsulate, attach to, or wrap around an electromagnetic radiation source.

The thickness of the graphene oxide free-standing film used to shield electromagnetic radiation can vary widely, since graphene oxide free-standing films of varying thickness can be formed by adjusting the volume of graphene oxide colloid applied on a substrate to be dried, and/or by stacking and/or binding multiple graphene oxide free-standing films. In some embodiments, the thickness of the graphene oxide free-standing film ranges from about 1 mm to about 5 mm.

In some embodiments, the graphene oxide free-standing film, the doped graphene oxide free-standing film, or their respective composites further comprising a flexible substrate comprising an electrically insulating material, a metal or alloy substrate, or a conductive ceramic substrate, are used to shield electromagnetic radiation at microwave frequencies ranging from 1 GHz to 12 GHz. The shielding effectiveness (SE) in dB is expressed by the following equations: SE=20 log(Ei/Et); SE=10 log (Pi/Pt), wherein E is the field strength in V/m, P is the field strength in W/m$^2$, i is the incident wave field, and t is the conduction field. According to the present disclosure, the shielding effectiveness of the graphene oxide free-standing film for electromagnetic radiation from 1 GHz to 12 GHz can be at least about 60 dB in one embodiment, at least about 65 dB in another embodiment, and at least about 70 dB in still another embodiment. In some embodiments, the shielding effectiveness for electromagnetic radiation at 1 GHz frequency may be at least about 70 dB, or may be over 90 dB in other embodiments. Shielding effectiveness can be improved by increasing the thickness of the graphene oxide free-standing film, by selecting one or more most shielding effective dopants and/or increasing the concentration(s) of the dopant(s), by selecting the most shielding effective form or shape of a metal, an alloy, a conductive ceramic, or an electrically insulating flexible material substrate on which the graphene oxide film is disposed, or by performing any combination thereof. Non-limiting examples of the forms or shapes of the substrate include a foil, a wire, a plate, a tube, and a net.

Having generally described this invention, a further understanding can be obtained by reference to certain specific examples which are provided herein for purposes of illustration only and are not intended to be limiting unless otherwise specified.

Example 1

Preparation of Graphene Oxide Nanosheets and Free-Standing Film

Figure 4:
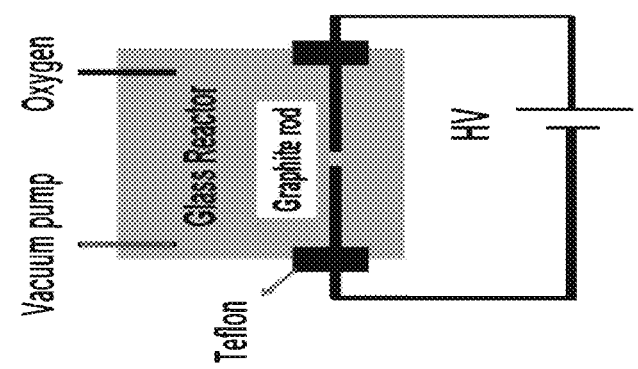
FIG. 4 is a schematic diagram illustrating the arc-discharge technique used to prepare graphene oxide nanosheets from graphite.

As shown in FIG. 4, graphene oxide nanosheets were synthesized from graphite by arc-discharge in a glass arc reactor comprising an anode, which was a graphite rod of 5 mm in diameter and 200 mm in length, and a cathode, which was a pure graphite rod of 5 mm in diameter and 230 mm in length. The cathode was horizontally fixed by a stationary Teflon holder (indicated by an arrow). The arc reactor was first evacuated by a vacuum pump. Then, with the anode tip gradually being moved towards the cathode, an arc-discharge process was maintained between the tips of the anode and the cathode with a voltage of approximately 50 KV and a DC current of about 25 A. Since the anode was consumed during the arc-discharge process, the anode had to be advanced manually towards the cathode to keep the arc gap between the electrodes at about 1 mm. Also during the arc-discharge process, oxygen gas was supplied to the arc reactor with a pressure of 260 Torr and a flow rate of 5-10 L/min. The duration of the arc-discharge process was about 2 seconds. After the arc-discharge process, cotton-like graphene oxide soot was attached to the wall of the arc reactor. The graphene oxide soot was collected and suspended in water with stirring for 1 hour to form a colloid at the concentration of 5 mg/ml.

Figure 5:
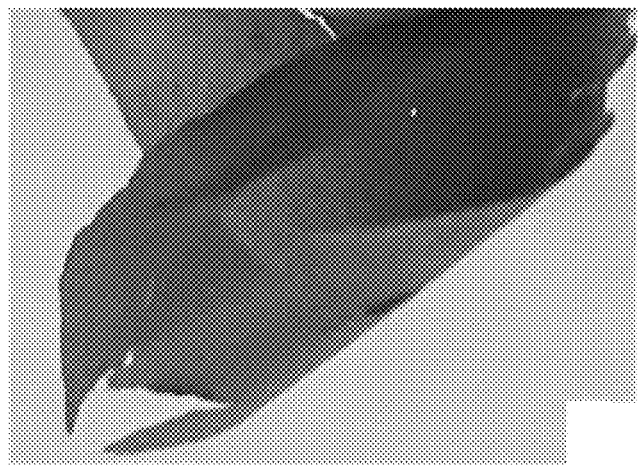
FIG. 5 is a photographic image of a graphene oxide free-standing film.

Graphene oxide free-standing film was made by filtration of the above graphene oxide colloid through a filter paper of 25 mm in diameter and 0.1 mm in pore size, followed by air drying and peeling the film from the filter. FIG. 5 is a picture of a graphene oxide free-standing film prepared therefrom. The thickness of each graphene oxide free-standing film was controlled by adjusting the volume of graphene oxide colloid applied to the filter paper.

Example 2

Figure 6:
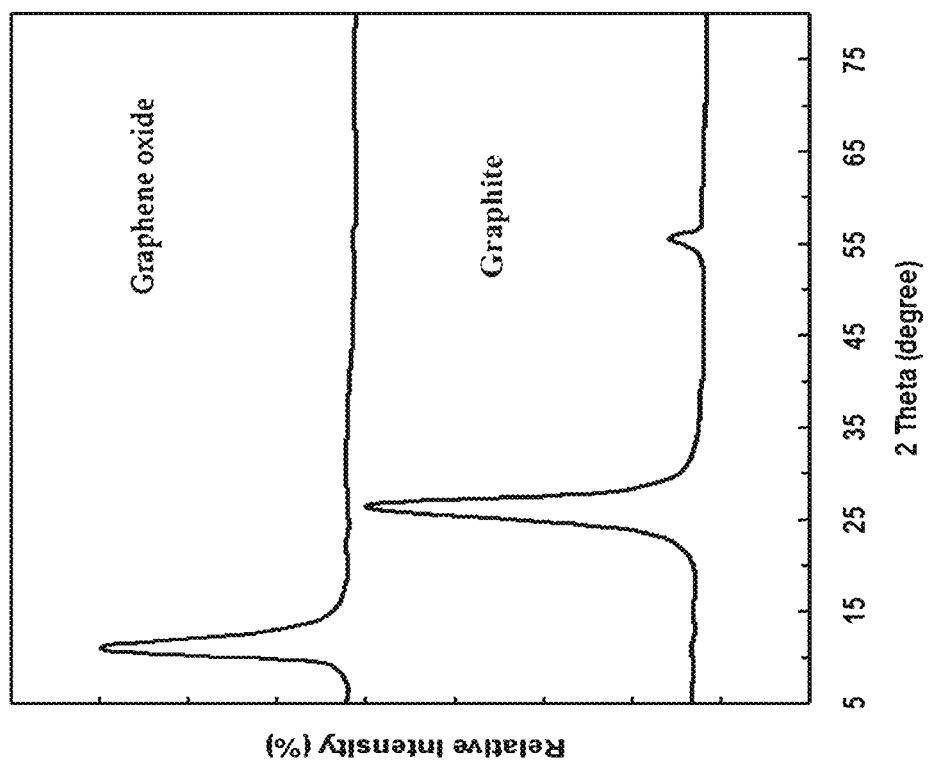
FIG. 6 is an X-ray diffraction diagram showing the X-ray spectra of pristine graphite and a graphene oxide free-standing film.

X-Ray Diffraction Analysis of Graphene Oxide Nanosheets in Graphene Oxide Free-Standing Film A graphene oxide free-standing film prepared according Example 1, as well as a pristine graphite sample, was subjected to X-ray Diffraction. In the X-ray diffraction diagram shown in FIG. 6, the graphene oxide free-standing film gave rise to a strong and sharp peak located at 2θ=11.2° (002), which is a typical diffraction peak of graphene oxide attributed to a conserved graphene-like honeycomb lattice in graphene oxide. Additionally, the observed interlayer spacing ($d_{002}$) of the graphene oxide free-standing film was about 0.75 nm, matching that of a typical graphene oxide. Further, the thickness of crystallite graphene oxide nanosheets was found to be about 6 nm.

By contrast, the pristine graphite sample, which has an interlayer distance ($d_{002}$) of 0.335 nm, gave rise to two reflection peaks at 2θ=26.6° (002) and 2θ=54.8° (004),

Example 3

Figure 7:
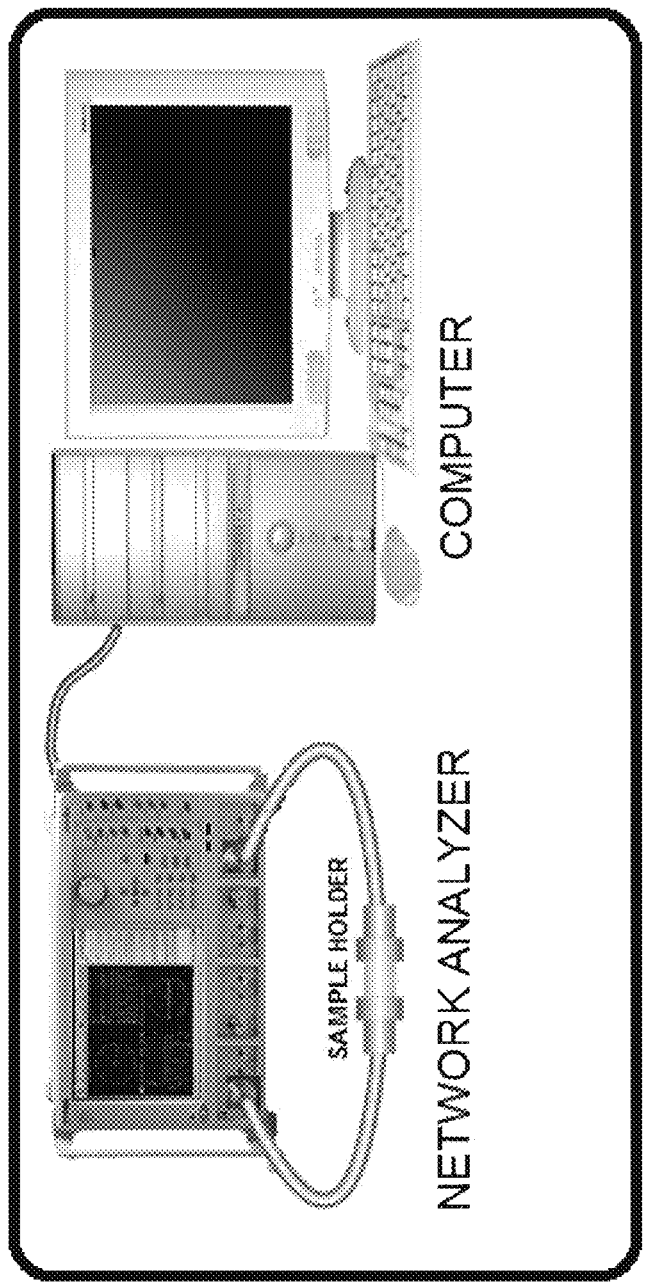
FIG. 7 is a diagram showing the apparatus system used to measure electromagnetic radiation shielding effectiveness.

Determination of Absorption Loss, Reflection Loss, and Shielding Effectiveness of Graphene Oxide Free-Standing Film for Electromagnetic Radiation at Frequencies from 1 GHz to 12 GHz In order to compare an electromagnetic radiation shielding effect, including absorption loss, reflection loss, and shielding effectiveness, depending on whether a graphene oxide free-standing film was provided or not, the shielding efficiency can be measured as follows:

FIG. 7 is a diagram showing an apparatus system for measurement of a shielding effect and configuration thereof. Electromagnetic shielding and dielectric parameters were measured using an Anritsu Vector Network Analyzer connected to a computer in a frequency range of 1-12 GHz. The graphene oxide free-standing film sample was prepared in the form of pellets and the sample was inserted in a sample holder connected between the wave-guide flanges of the network analyzer. In order to neglect any electromagnetic radiation loss and power redistribution due to the sample holder, two port calibration was used.

Figure 8:
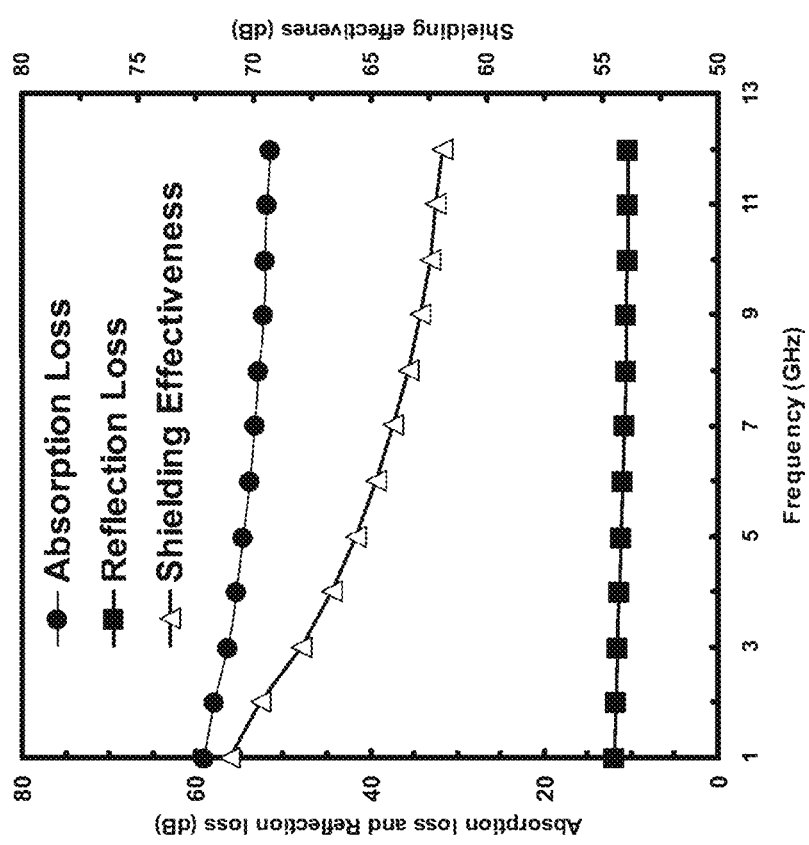
FIG. 8 is a graphical presentation of the absorption loss, reflection loss, and shielding effectiveness of a graphene oxide free-standing film for electromagnetic radiation at frequencies from 1 GHz to 12 GHz.

FIG. 8 shows the dependence of the absorption loss, reflection loss, and shielding effectiveness of a 1 mm thick graphene oxide free-standing film on the electromagnetic radiation frequency. The absorption loss and shielding effectiveness of the film decreased with increasing frequencies from 1 GHz to 12 GHz, whereas the reflection loss remained mostly unchanged. Specifically, the absorption loss of the free-standing film was about 60 dB for the electromagnetic radiation at 1 GHz frequency, and decreased to about 50 dB when the electromagnetic radiation frequency was raised to 12 GHz. Likewise, the shielding effectiveness of the graphene oxide free-standing film was about 72 dB for the electromagnetic radiation at 1 GHz frequency, and decreased to slightly over 60 dB for the electromagnetic radiation at 12 GHz frequency.

Figure 9:
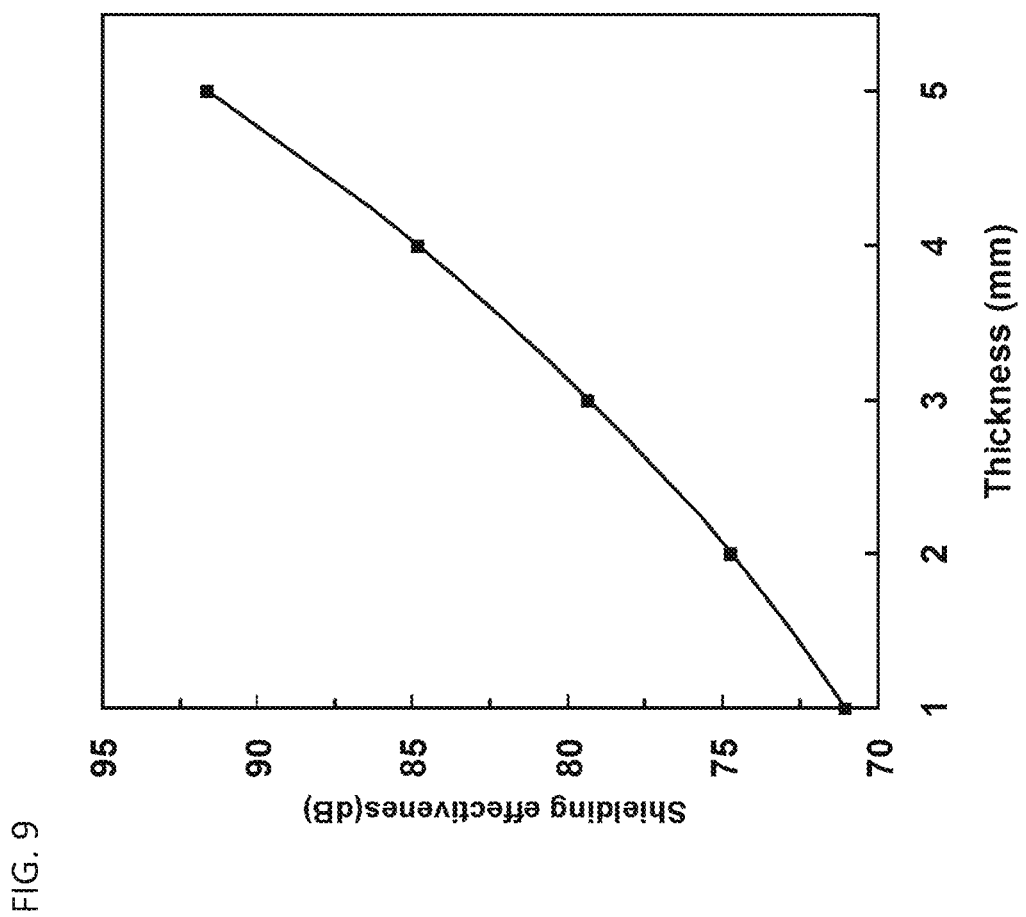
FIG. 9 is a graphical presentation of the shielding effectiveness of a graphene oxide free-standing film of varying thickness for electromagnetic radiation at 1 GHz frequency.

FIG. 9 shows the effect of thickness on the shielding effectiveness of a graphene oxide free-standing film for electromagnetic radiation at 1 GHz frequency. The shielding effectiveness was increased with increasing thickness of the graphene oxide free-standing film. Specifically, the shielding effectiveness was about 72 dB when the film was 1 mm thick; it was increased to about 75 dB when the film was 2 mm thick, further increased to about 80 dB when the film was 3 mm thick, to about 85 dB when the film was 4 mm thick, and to about 93 dB when the film was 5 mm thick. An increase in thickness of the film enhances both absorption and multiple internal reflections, resulting in higher shielding effectiveness.

The invention claimed is:

1. A free-standing film that absorbs and/or reflects electromagnetic radiation having a frequency from 1 GHz to 12 GHz, comprising:
stacked layers of graphene oxide nanosheets oriented parallel to the film surface and stacked layers of graphene oxide nanosheets oriented perpendicular to the film surface;
wherein the graphene oxide nanosheets have a carbon to oxygen (C/O) ratio of 1.2 to 2.5; and
wherein the film surface contains wrinkles, and wherein the wrinkles have a height, measured from a basal plane of the film surface to a top of the wrinkles, ranging from 0.5 to 2.5 nm.

2. The free-standing film of claim 1, wherein said graphene oxide nanosheets have an average thickness of from 4 to 8 nm.

3. An electrical or electronic device covered with the free-standing film of claim 1.

4. An electromagnetic interference shielding gasket comprising the free-standing film of claim 1.

5. A method for making the film of claim 1, the method comprising:
forming graphene oxide by arc-discharge between graphite electrodes in the presence of oxygen gas to form a graphene oxide soot,
suspending the graphene oxide soot in water to form a colloid,
depositing the colloid onto a substrate to form a wet paper, and
drying the wet paper to form the film.

6. The method of claim 5, wherein each of, the graphite electrodes has a diameter ranging, from 1 mm to 10 mm and a length ranging from 100 mm to 400 mm.

7. The method of claim 5, wherein the arc-discharge is carried out with the arc gap between the graphite electrodes ranging from 0.5 mm to 2 mm, the voltage ranging from 25 KV to 100 KV, and the DC current ranging from 10 A to 50 A.

8. A method of shielding electromagnetic radiation by using the free-standing film of claim 1, the method comprising:
enclosing and/or encapsulating an electromagnetic radiation generating source with said free-standing film to shield electromagnetic radiation.

9. The method of claim 8, wherein the thickness of said free-standing film ranges from about 1 mm to about 5 mm.

10. The method of claim 8, wherein the frequencies of said electromagnetic radiation range from 1 GHz to 12 GHz.

11. The method of claim 10, wherein the shielding effectiveness is at least about 60 dB.

12. The method of claim 10, wherein the shielding effectiveness for said electromagnetic radiation at 1 GHz frequency is at least about 70 dB.

13. The free-standing film of claim 1, wherein the graphene oxide nanosheets are not doped.

14. The free-standing film of claim 1, which contains no graphene.

15. The free-standing film of claim 1, which consists of the stacked layers of graphene oxide nanosheets.

* * * * *